US012562358B2

(12) United States Patent
Turner et al.

(10) Patent No.: US 12,562,358 B2
(45) Date of Patent: Feb. 24, 2026

(54) SYSTEM AND METHOD FOR DETECTING ENDPOINT IN PLASMA PROCESSING

(71) Applicant: HORIBA STEC CO., LTD., Kyoto (JP)

(72) Inventors: Terry R. Turner, Austin, TX (US); Jerome R. Cannon, Austin, TX (US)

(73) Assignee: HORIBA STEC CO., LTD. (JP)

( * ) Notice: Subject to any disclaimer, the term of this patent is extended or adjusted under 35 U.S.C. 154(b) by 400 days.

(21) Appl. No.: 18/139,470

(22) Filed: Apr. 26, 2023

(65) Prior Publication Data

US 2023/0352283 A1 Nov. 2, 2023

Related U.S. Application Data

(60) Provisional application No. 63/335,974, filed on Apr. 28, 2022.

(51) Int. Cl.
*H01J 37/32* (2006.01)
*G01N 22/00* (2006.01)

(52) U.S. Cl.
CPC ........ *H01J 37/32963* (2013.01); *G01N 22/00* (2013.01); *H01J 37/32091* (2013.01); *H01J 37/32357* (2013.01); *H01J 37/32568* (2013.01); *H01J 37/32577* (2013.01); *H01J 2237/24564* (2013.01); *H01J 2237/334* (2013.01)

(58) Field of Classification Search
CPC ........... H01J 37/32963; H01J 37/32091; H01J 37/32357; H01J 37/32568; H01J 37/32577; H01J 2237/24564; H01J 2237/334; H01J 37/32935; H01J 37/3299; H01J 37/32972; G01N 22/00; H01L 21/67253; H01L 21/67248; H01L 22/20; C23C 16/52; C23C 14/54
USPC ............ 118/663, 665, 688, 668; 156/345.24, 156/345.25, 345.26, 345.27, 345.28
See application file for complete search history.

(56) References Cited

U.S. PATENT DOCUMENTS

| | | | | | |
|---|---|---|---|---|---|
| 5,556,549 | A | * | 9/1996 | Patrick ..................... | H05H 1/46 118/712 |
| 5,576,629 | A | * | 11/1996 | Turner ................... | C23C 16/52 336/155 |
| 5,837,094 | A | * | 11/1998 | Tsukazaki ......... | H01L 21/67748 204/298.31 |
| 5,902,403 | A | * | 5/1999 | Aitani ............... | H01J 37/32963 156/916 |
| 5,966,586 | A | * | 10/1999 | Hao .................. | H01J 37/32935 438/18 |
| 6,366,346 | B1 | * | 4/2002 | Nowak ............. | H01J 37/32834 216/60 |

(Continued)

*Primary Examiner* — Rudy Zervigon
(74) *Attorney, Agent, or Firm* — Brooks Kushman P.C.

(57) ABSTRACT

A plasma processing control method for detecting an endpoint and controlling plasma processing is disclosed. The plasma processing control method includes tracking one or more harmonics that are produced due to nonlinearity of an impedance of a plasma environment. The one or more harmonics are associated with voltage, current, or a combination thereof. The plasma processing control method further includes analyzing the tracked one or more harmonics and detecting an endpoint of plasma processing based on the analysis of the tracked one or more harmonics. Thereafter, the plasma processing control method includes stopping the plasma processing based on the detected endpoint.

17 Claims, 8 Drawing Sheets

(56)                    References Cited

U.S. PATENT DOCUMENTS

| | | | |
|---|---|---|---|
| 6,592,817 B1 * | 7/2003 | Tsai ................. | H01J 37/32935 |
| | | | 422/62 |
| 10,032,681 B2 | 7/2018 | Bailey, III et al. | |
| 10,332,760 B2 | 6/2019 | Mori et al. | |
| 2003/0052085 A1 * | 3/2003 | Parsons ............ | H01J 37/32082 |
| | | | 118/712 |
| 2006/0048891 A1 * | 3/2006 | Yue ................... | H01J 37/32935 |
| | | | 156/345.25 |
| 2009/0261839 A1 * | 10/2009 | Turner ............. | H01J 37/32935 |
| | | | 324/459 |
| 2020/0075297 A1 * | 3/2020 | Oishi ............... | H01J 37/32834 |
| 2023/0352284 A1 * | 11/2023 | Turner .................. | G01R 23/16 |
| 2024/0404804 A1 * | 12/2024 | Paterson .......... | H01J 37/32174 |

* cited by examiner

TRANSDUCER ASSEMBLY
106

204

206

208

SAMPLED RF
VOLTAGE

SAMPLED RF
CURRENT

INDUCTIVE
PICKUP

202

CAPACITIVE
PICKUP

RF CURRENT CARRIER

300

OUTPUT

308

Nonlinear Conductivity
CURVE

302

GAIN SLOPE

INPUT 1KHZ

304

OUTPUT HARMONIC
SPECTRA

Amplitude

306

FREQUENCY IN KHZ

700

800

804

802

1000

1002 ~

START

1004 ~

TRACK HARMONICS PRODUCED DUE TO NON-LINERARITY OF AN IMPEDENCE OF A PLASMA ENVIRONMENT

1006 ~

ANALYSE THE BACKED HARMONICS

1008 ~

DETECT AN ENDPOINT OF THE PLASMA PROCESSING

1010 ~

STOP THE PLASMA PROCESSING

1012 ~

STOP

SYSTEM AND METHOD FOR DETECTING ENDPOINT IN PLASMA PROCESSING

The present disclosure is U.S. Non-Provisional Application that claims the benefit of U.S. Provisional Application No. 63/335,974, filed Apr. 28, 2022 having title of VARIABLE FREQUENCY RF ENDPOINT DETECTOR; all of which is incorporated herein by reference.

BACKGROUND

Technical Field

The present disclosure relates to the field of plasma processing, and in particular, relates to a system and method for detecting an endpoint in plasma processing to stop the plasma processing.

Description of the Related Art

Plasma processing refers to the use of plasma, a high-energy state of matter, to modify or alter properties of a wide range of materials to make them easier to paint, print or bond together. Plasma processing can be used to clean, activate, etch, or coat a surface of a material, such as a substrate. The plasma processing technique is widely used in the field of electronics, material science, and biotechnology. For example, the plasma processing technique is a dominant means of pattern transfer in microelectronic device fabrication that is commonly used in both semiconductor and display manufacturing.

Typically, the plasma processing apparatus includes a plasma processing chamber, a gas delivery system, a power source such as a Radio Frequency (RF) power source, and a substrate holder. The plasma processing chamber is an enclosure that receives a supply of gas via the gas delivery system that is ionized by the electromagnetic waves produced by the power source. The electromagnetic waves lead to the separation of the atoms into positively charged ions and negatively charged electrons that interact with each other leading to a self-sustaining reaction that creates a plasma environment. Such plasma environments can be controlled by adjusting parameters of the plasma processing apparatus, such as the type of gas used, the pressure inside the plasma processing chamber, and the frequency and power of the electromagnetic waves.

However, the plasma environments are intrinsically non-linear which means that if a single frequency energy is delivered to the plasma, then some of the energy will be frequency shifting to harmonics of the incident single frequency. Therefore, the harmonics are a byproduct of the plasma processing that causes one or more problems in plasma processing, such as Electromagnetic Interference (EMI) and Radio-Frequency Interference (RFI), unstable plasma, equipment damage, and safety hazards. The harmonics in the plasma processing apparatus can increase the intensity of EMI/RFI with other equipment in the vicinity leading to potential malfunctions or data corruption. Further, the unstable plasma created due to the unwanted harmonics can cause additional problems such as non-uniform processing, poor quality of deposited films, non-reproducibility of the process, and perturbations in the plasma that destabilizes the electron density and temperature, leading to fluctuations in the plasma properties. Furthermore, the harmonics increase the current flow in the different components of the plasma processing apparatus leading to the overheating and failure of components resulting in downtime and increased maintenance costs.

Therefore, stopping the plasma process at the right time is very important to mitigate problems caused due to unwanted harmonics. Along with mitigating the effects of unwanted harmonics, endpoint detection also leads to a consistent and repeatable process with the added control of plasma processing. Precise endpoint detection can also contribute to cost-effectiveness by reducing the amount of time and energy required for the plasma processing and can provide improved safety by stopping the plasma processing before an unsafe condition arises. Some of the prior art references that disclose the plasma processing control apparatus are given below:

U.S. Pat. No. 10,332,760B2 discloses a plasma processing apparatus having a plasma processing chamber with a first electrode that emits a radio frequency into the plasma processing chamber supplied by a first radio frequency power supply. The '760 patent includes an endpoint determination circuit that extracts control parameters, that are sensitive to time variation, and monitored in etching or cleaning. Further, '760 patent discloses calculating a monitor signal of the counter bias voltage based on the signal of the monitored parameter to determine the endpoint.

U.S. Pat. No. 10,032,681B2 discloses a method of determining an etch process endpoint of a target geometric parameter value for one or more features produced on a substrate during an etch process. The patent '681 includes measuring optical signals produced during the etching and finding a subset of the measured optical signals that has its values correlated with the values of a target geometric parameter. The patent '681 further includes determining the current value of the target geometric parameter of the feature being etched to compare with an etch process endpoint value for the target geometric parameter. Thereafter, the '681 patent includes determining that the endpoint of the process is reached based on the result of the comparison.

Accordingly, the prior art reference discloses endpoint detection that is based on parameters that are either time-dependent or geometry dependent. Thus, the endpoint detection as disclosed in the prior art reference is dependent on the material of the substrate, the type of gas used, and the pressure inside the process chamber. Further, the endpoint detection as disclosed in the prior art references lacks accuracy at least due to its dependency on one or more physical parameters. Therefore, there is a need for an improved system and method for detecting endpoints in plasma processing that accurately detects when the plasma processing must be stopped and to overcome the above-mentioned drawbacks of the known technologies.

BRIEF SUMMARY

One or more embodiments are directed to a plasma processing control system and method for detecting an endpoint and controlling in-situ plasma processing.

An embodiment of the present disclosure discloses a plasma processing control system for detecting an endpoint and controlling in-situ plasma processing. The plasma processing control system includes a power generator to generate energy for ionizing gas in a plasma processing chamber in which a substrate to be plasma-processed is kept. The substrate is associated with a semiconductor, display manufacturing, or a combination thereof and the plasma processing is performed for depositing or removing a film on the substrate. Further, the ionization of the gas creates a plasma environment for the plasma processing of the substrate. In order to ionize the gas, the power generator generates high-frequency waves, such as an RF and an electromagnetic wave, having a single sinusoidal frequency with a nominal fixed (e.g., 50-ohm) output impedance. In an embodiment, the power generator corresponds to a Radio Frequency (RF) power generator, an electromagnetic power generator, or a Redundant Power Supply (RPS) system.

Further, the plasma processing control system includes a transducer assembly to track one or more harmonics that are produced due to the nonlinearity of an impedance in a plasma environment. In an embodiment, the impedance of the plasma environment is a complex nonlinear impedance (e.g., non-50-ohm impedance), or a combination thereof. According to some embodiment of the present disclosure, one or more harmonics may be associated with voltage, current, or a combination thereof. In an embodiment, the transducer assembly includes a voltage-sensitive transducer and a current-sensitive transducer to track the voltage harmonics and the current harmonics, respectively.

The plasma processing control system further includes one or more spectrum analyzers to analyze the tracked one or more harmonics. According to some embodiment of the present disclosure, one or more spectrum analyzers detect an endpoint of the plasma processing based on the analysis of the tracked one or more harmonics. In an embodiment, the one or more spectrum analyzers utilize RF spectroscopy to analyze the tracked one or more harmonics and detect the endpoint of the plasma processing. Further, each of the one or more spectrum analyzers includes an RF input attenuator, a pre-selector, a low-pass filter, a local oscillator, a mixer, an Intermediate Frequency (IF) gain module, an IF filter, an analog-to-digital converter, a digital IF, a fast Fourier transform module, a video bandwidth filter, and a display working in tandem. Further, the plasma processing control system includes a controller to stop the plasma processing based on the detected endpoint.

In an embodiment of the present disclosure, the plasma processing control system further includes a local matching network that matches the impedance of the high-frequency wave generated by the power generator with the impedance of the plasma environment.

An embodiment of the present disclosure discloses a plasma processing control system for detecting an endpoint in downstream plasma processing and controlling plasma processing. The plasma processing control system includes an electrode assembly inserted in an exhaust line of a plasma processing chamber to receive its effluent as a feed gas. The plasma processing control system further includes a power generator to generate energy for ionizing the received feed gas in the electrode assembly. The ionization of the feed gas leads to a formation of a plasma environment to create a small capacitively coupled plasma.

Further, the plasma processing control system includes a dual-directional coupler coupled between the electrode assembly and the power generator, such that both forward power to the electrode assembly and reflected power from the electrode assembly are received at the dual-directional coupler. The plasma processing control system also includes one or more spectrum analyzers to analyze both the received forward and reflected power.

According to some embodiment of the present disclosure, the one or more spectrum analyzers detect an endpoint of the plasma processing based on the analysis of the received forward and reflected power. In an embodiment, the one or more spectrum analyzers utilize RF spectroscopy to analyze the received forward and reflected power and detect the endpoint of the plasma processing. Additionally, the plasma processing control system includes a controller to stop the plasma processing based on the detected endpoint.

In an embodiment, the plasma processing control system further includes an electrode assembly power control to control the amount of power being supplied by the power generator.

An embodiment of the present disclosure discloses a plasma processing control method for detecting an endpoint and controlling plasma processing. The plasma processing control method includes tracking one or more harmonics that are produced due to the nonlinearity of an impedance of a plasma environment. The one or more harmonics are associated with voltage, current, or a combination thereof. Further, the plasma processing control method includes analyzing the tracked one or more harmonics and detecting an endpoint of plasma processing based on the analysis of the tracked one or more harmonics. Thereafter, the plasma processing control method includes stopping the plasma processing based on the detected endpoint.

The features and advantages of the subject matter here will become more apparent in light of the following detailed description of selected embodiments, as illustrated in the accompanying FIGUREs. As will be realized, the subject matter disclosed is capable of modifications in various respects, all without departing from the scope of the subject matter. Accordingly, the drawings and the description are to be regarded as illustrative in nature.

BRIEF DESCRIPTION OF THE DRAWINGS

The present subject matter will now be described in detail with reference to the drawings, which are provided as illustrative examples of the subject matter so as to enable those skilled in the art to practice the subject matter. Notably, the FIGUREs and examples are not meant to limit the scope of the present subject matter to a single embodiment, but other embodiments are possible by way of interchange of some or all of the described or illustrated elements and, further, wherein.

Figure 1:
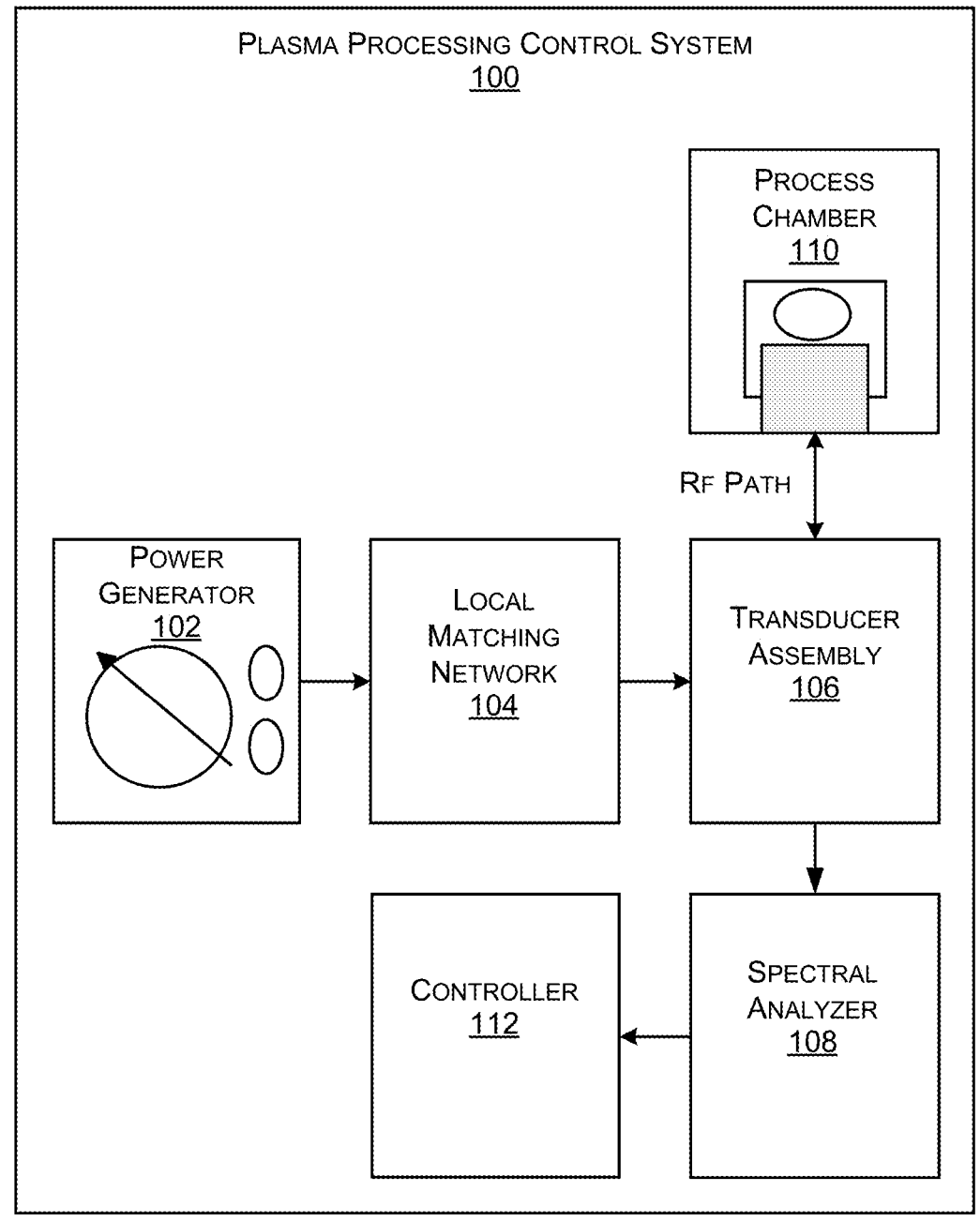
FIG. 1 illustrates a block diagram of a plasma processing control system for detecting an endpoint and controlling in-situ plasma processing, in accordance with various embodiments of the present disclosure.

Other features of embodiments of the present disclosure will be apparent from accompanying drawings and detailed description that follows.

DETAILED DESCRIPTION

In the following description, for purposes of explanation, numerous specific details are set forth in order to provide a thorough understanding of the present disclosure. It will be apparent, however, to one skilled in the art that the present disclosure is not limited to these specific details. In other instances, structures and devices are shown in block diagram form only in order to avoid obscuring the present technology.

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection. Based on the disclosure provided herein, one of ordinary skill in the art will appreciate a variety of ways in which connection or coupling exists in accordance with the aforementioned definition.

If the specification states a component or feature "may", "can", "could", or "might" be included or have a characteristic, that particular component or feature is not required to be included or have the characteristic.

Reference in this specification to "one embodiment" or "an embodiment" means that a particular feature, structure, or characteristic described in connection with the embodiment is included in at least one embodiment of the present disclosure. The appearance of the phrase "in one embodiment" in various places in the specification are not necessarily all referring to the same embodiment, nor are separate or alternative embodiments mutually exclusive of other embodiments. Further, the terms "a" and "an" herein do not denote a limitation of quantity, but rather denote the presence of at least one of the referenced items. Moreover, various features are described which may be exhibited by some embodiments and not by others. Similarly, various requirements are described which may be requirements for some embodiments but not for other embodiments.

Further, the terms "semiconductor wafer," "wafer," "substrate," "wafer substrate," and "partially fabricated integrated circuit" are used interchangeably. One of the ordinary skills in the art would understand that the term "partially fabricated integrated circuit" can refer to a silicon wafer during any of many stages of integrated circuit fabrication thereon. A wafer used in the semiconductor device industry typically has a diameter of 200 mm, or 300 mm, or 450 mm. The following detailed description assumes the disclosure is implemented on a wafer. However, the disclosure is not so limited. The workpiece may be of various shapes, sizes, and materials. In addition to semiconductor wafers, other work pieces that may take advantage of this disclosure include various articles such as printed circuit boards, magnetic recording media, magnetic recording sensors, mirrors, optical elements including pixelated displays, micro-mechanical devices, and the like.

Fabrication of certain semiconductor devices involves etching features into a material or materials. The material may be a single layer of material or a stack of materials. In some cases, a stack includes alternating layers of material (e.g., silicon nitride and silicon oxide). One example etched feature is a cylinder. In various embodiments herein, features are etched in a substrate (typically a semiconductor wafer) having dielectric, semiconductor, and/or conductor material on the surface. The etching processes are generally plasma-based etching processes. A feature is a recess on the surface of a substrate. Features can have many different shapes including, but not limited to, cylinders, rectangles, squares, other polygonal recesses, trenches, etc. Examples of etched features include various gaps, holes or vias, trenches, and the like.

In certain embodiments, a plasma processing control system are disclosed. The plasma processing control system may be coded or otherwise implemented in a plasma processing apparatus such that when it executes it provides real-time monitoring of the plasma process in the plasma processing apparatus. In some implementations, the system determines or assists in determining the endpoint of the plasma processing.

Further, the plasma processing is modelled and/or monitored as described herein and may be characterized by various features. For example, the process may be characterized by the type of material or substrate being plasma processed for etching. The etched material may be a conductor, a dielectric, a semiconductor, or any combination thereof. Further, the etched material may be monolithic or layered. It may be used to form memory and/or logic devices. Examples of dielectric materials for etching include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, $SiN$, $SiON$, $SiOC$, $SiCN$, etc. Examples of conductor materials include, but are not limited to, nitrides such as titanium nitride and tantalum nitride and metals such as cobalt, aluminum, ruthenium, hafnium, titanium, tungsten, platinum, iridium, palladium, manganese, nickel, iron, silver, copper, molybdenum, tin, and various alloys, including alloys of these metals. Examples of semiconductor materials include, but are not limited to, doped and undoped silicon, germanium, gallium arsenide, etc. Any of the above conductors, semiconductors, and dielectrics may have a distinct morphology such as polycrystalline, amorphous, single crystal, and/or microcrystalline. Other materials that may be etched include, but are not limited to, $CoFeB$, $Ge2Sb2Te2$, $InSbTe$ compounds, $Ag—Ge—S$ compounds, and $Cu—Te—S$ compounds. The concept can be extended to materials like $NiOx$, $SrTiOx$, perovskite ($CaTiO3$), $PrCaMnO3$, $PZT$ ($PbZr1-xTixO3$), $(SrBiTa)O3$, and the like.

The etch process may be primarily physical (e.g., non-reactive ion bombardment), primarily chemical (e.g., chemical radicals with only small directional bombardment), or any combination thereof. When a chemical etch is included, the chemical reactant may be any one or more of a variety of etchants including, for example, reactants containing fluorocarbons, fluorine, oxygen, chlorine, etc. Example etchants include chlorine ($Cl2$), boron trichloride ($BCl3$), sulfur hexafluoride ($SF6$), nitrogen trifluoride ($NF3$), dichlorodifluoromethane (CCl2F2), phosphorus trifluoride (PF3), trifluoromethane (CHF3), carbonyl fluoride (COF2), oxygen (O2), carbon tetrachloride (CCl4), silicon tetrachloride (SiCl4), carbon monoxide (CO), nitric oxide (NO), methanol (CH3OH), ethanol (C2H5OH), acetylacetone (C5H8O2), hexafluoroacetylacetone (C5H2F6O2), thionyl chloride (SOCl2), thionyl fluoride (SOF2), acetic acid (CH3COOH), pyridine (C5H5N), formic acid (HCOOH), and combinations thereof. In various embodiments, a combination of these etching reactants is used.

Embodiments described herein may be discussed in the general context of computer-executable instructions residing on some form of computer-readable storage media, such as program modules, executed by one or more computers or other devices. By way of example, and not limitation, computer-readable storage media may include non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Some portions of the detailed description that follows are presented and discussed in terms of a process or method. Although steps and sequencing thereof are disclosed in figures herein describing the operations of this method, such steps and sequencing are exemplary. Embodiments are well suited to performing various other steps or variations of the steps recited in the flowchart of the figure herein and in a sequence other than that depicted and described herein. Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

In some implementations, the flowchart and block diagrams in the Figures illustrate the architecture, functionality, and operation of possible implementations of apparatus (systems), methods, and computer program products according to various implementations of the present disclosure. Each block in the flowchart and/or block diagrams, and combinations of blocks in the flowchart and/or block diagrams, may represent a module, segment, or portion of code, which includes one or more executable computer program instructions for implementing the specified logical funct-ion(s)/act(s). These computer program instructions may be provided to a processor of a general-purpose computer, special-purpose computer, or other programmable data processing apparatus to produce a machine, such that the computer program instructions, which may execute via the processor of the computer or other programmable data processing apparatus, create the ability to implement one or more of the functions/acts specified in the flowchart and/or block diagram block or blocks or combinations thereof. It should be noted that, in some implementations, the functions noted in the block(s) may occur out of order noted in the figures. For example, two blocks shown in succession may, in fact, be executed substantially concurrently, or the blocks may sometimes be executed in the reverse order, depending upon the functionality involved.

Embodiments of the present disclosure include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, firmware, and/or by human operators.

Thus, for example, it will be appreciated by those of ordinary skill in the art that the diagrams, schematics, illustrations, and the like represent conceptual views or processes illustrating systems and methods embodying this disclosure. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this disclosure. Those of ordinary skill in the art further understand that the exemplary hardware, software, processes, methods, and/or operating systems described herein are for illustrative purposes and, thus, are not intended to be limited to any particular named.

Embodiments of the present disclosure relate to a plasma processing control system for detecting an endpoint and controlling an in-situ plasma processing, a plasma processing control system for detecting an endpoint in a downstream plasma processing for stopping the plasma processing, and a plasma processing control method for detecting an endpoint and controlling plasma processing. The plasma processing control system includes a power generator to generate adequate energy for ionizing gas in a plasma processing chamber in which a substrate to be plasma-processed is kept. The ionization of the gas creates a plasma environment for plasma processing the substrate. Further, the plasma processing control system includes a transducer assembly to track one or more harmonics that are produced due to nonlinearity of an impedance in a plasma environment. The one or more harmonics are associated with voltage and current. The plasma processing control system also includes one or more spectrum analyzers to analyze the tracked one or more harmonics and detect an endpoint of the plasma processing based on the analysis of the tracked one or more harmonic. Additionally, the plasma processing control system includes a controller to stop the plasma processing based on the detected endpoint.

FIG. 1 illustrates a block diagram of a plasma processing control system 100 for detecting an endpoint and controlling in-situ plasma processing. In-situ plasma processing is a technique in which several processes for plasma processing are carried out in sequence without exposing a substrate to air between the processes. The in-situ plasma processing requires placing the substrate in a process chamber 110 of the plasma processing apparatus (not shown). The process chamber 110 may also be termed as a plasma processing chamber 110 for the purpose of the explanation of the disclosure. Upon placement of the substrate, a gas is released in the plasma processing chamber 110. In an embodiment of the present disclosure, the gas may be an inert gas such as argon and neon. In another embodiment of the present disclosure, the gas may be a reactive gas such as oxygen. In yet another embodiment of the present disclosure, air may be used instead of a particular gas without departing from the scope of the disclosure. The substrate kept in the plasma processing chamber 110 for plasma processing may be associated with a semiconductor, display manufacturing, or a combination thereof. The plasma processing may be performed for depositing or removing a film on the substrate.

In an embodiment of the present disclosure, the plasma processing control system 100 may include a power generator 102, a local matching network 104, a transducer assembly 106, one or more spectral analyzers 108, the process chamber 110, and a controller 112. The power generator 102 may generate energy in controlled manner for ionizing the gas in the plasma processing chamber 110. In an embodiment, the power generator 102 may include a Radio Frequency (RF) power generator, an electromagnetic power generator, and a Remote Plasma System (RPS). Accordingly, the energy generated by the power generator 102 may include a high-frequency wave such as an RF and an electromagnetic wave. For example, the power generator 102 may generate a high-frequency wave having a single sinusoidal frequency with a nominal 50-ohm output impedance. In order to ionize the gas in the plasma processing chamber 110, the generated energy may be transferred to one or more electrodes installed in the plasma processing chamber 110, which in turn may emit the generated energy for ionization of the gas. Further, the ionization of the gas may create a plasma environment that may facilitate the plasma processing of the substrate.

In an embodiment of the present disclosure, the created plasma environment may have a nonlinear impedance such as a non-50-ohm impedance and a complex nonlinear impedance. The complex nonlinear impedance may be because of the voltage and current of the plasma environment being non-proportional and may be highly complex. Such nonlinearity of the impedance of the plasma environment leads to the formation of harmonics in the plasma processing apparatus.

In order to minimize such harmonics, the plasma processing control system 100 may utilize a local matching network 104 to match the impedance of the high-frequency wave generated by the power generator 102 with the impedance of the plasma environment. However, load side of the impedance matching network is typically nonlinear thus, the harmonics of the incident frequency at the load side are not eliminated. Such harmonics may be associated with voltage, current, or a combination thereof. It may be noted that such harmonics have amplitudes that vary over time as etching processes progress from the beginning to the end of pattern delineation in a film on the surface of the substrate.

In an embodiment of the present disclosure, the transducer assembly 106 may track the created one or more harmonics. In an embodiment, the transducer assembly 106 may include a voltage-sensitive transducer to track the voltage harmonics. In another embodiment, the transducer assembly 106 may include a current-sensitive transducer to track the current harmonics, yet another embodiment may contain both.

In an embodiment of the present disclosure, the one or more spectrum analyzers 108 may analyze the tracked one or more harmonics. In one instance, one spectrum analyzer

108 may be utilized to track both the voltage harmonics and the current harmonics. In another instance, different spectrum analyzers 108 may be utilized for the voltage harmonics and the current harmonics. Further, the one or more spectrum analyzers 108 may detect an endpoint of the plasma processing based on the analysis of the tracked one or more harmonics. In an embodiment of the present disclosure, the one or more spectrum analyzers 108 may utilize RF spectroscopy to analyze the tracked one or more harmonics and detect the endpoint of the plasma processing.

In an embodiment of the present disclosure, the controller 112 may stop the plasma processing based on the detected endpoint. In one implementation, the controller 112 may be an ON-OFF controller to provide a digital output signal that switches OFF one or more components of the plasma processing apparatus to stop the plasma processing. In another implementation, the controller 112 may be a smart controller, such as a fuzzy logic controller, to turn OFF the one or more components of the plasma processing apparatus to stop the plasma processing based on the detected endpoint.

Figure 2:
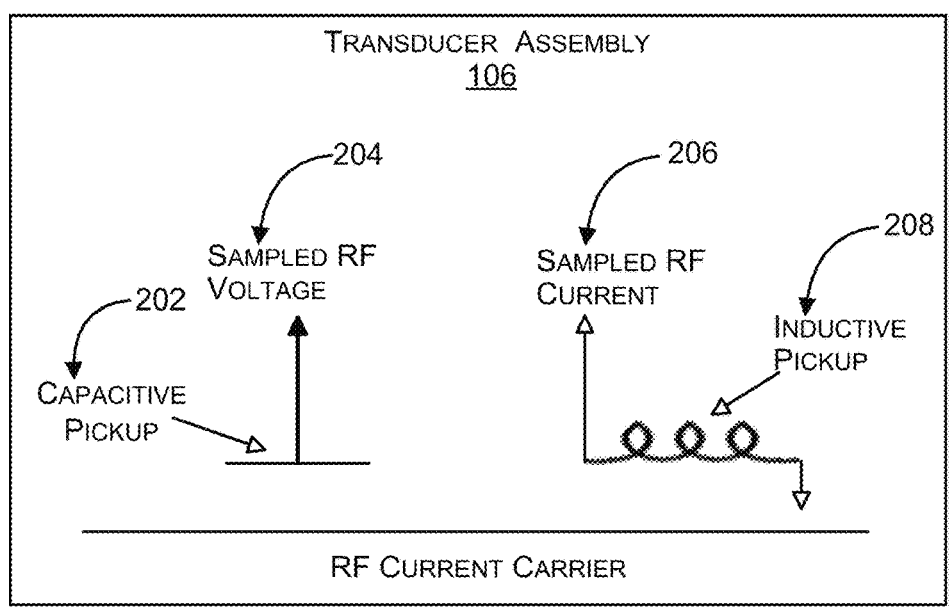
FIG. 2 illustrates a transducer assembly, in accordance with an embodiment of the present disclosure.

FIG. 2 illustrates the transducer assembly 106, in accordance with an embodiment of the present disclosure. In an embodiment of the present disclosure, the transducer assembly 106 includes a voltage-sensitive transducer and a current-sensitive transducer. The voltage-sensitive transducer includes a capacitive pickup 202 to track the voltage harmonics and convert them into voltage electrical signals via sampled RF voltage 204. Further, the current-sensitive transducer includes an inductive pickup 208 to track the current harmonics and convert them into a current electrical signal via sampled RF current 206.

Figure 3:
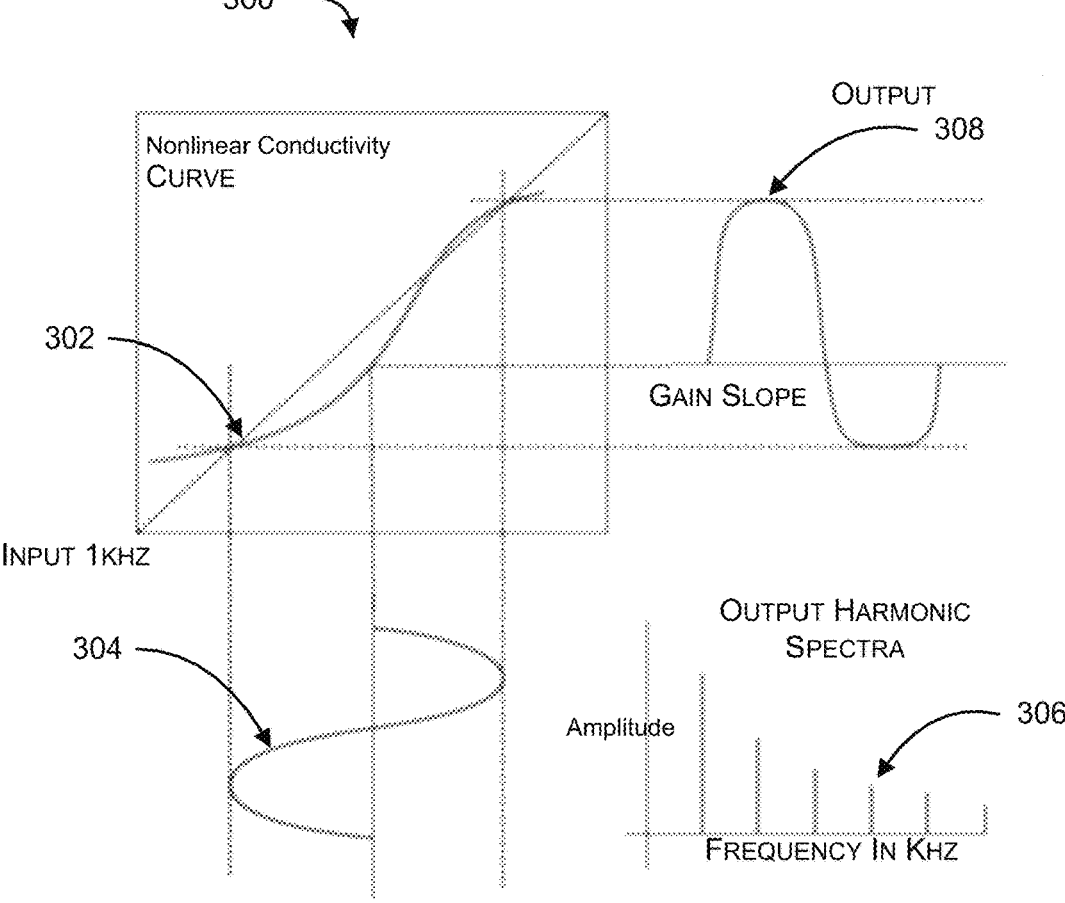
FIG. 3 illustrates an example of harmonics generated due to the nonlinearity of the plasma environment, in accordance with an embodiment of the present disclosure.

FIG. 3 illustrates generation of harmonics 300 due to nonlinearity of plasma environment, in accordance with an embodiment of the present disclosure. In an embodiment of the present disclosure, the plasma environment, which has a nonlinear conductivity curve 302 in response to a sinusoidal input wave 304 having an input frequency of 1 kHz. As illustrated, the output 308 will be non-sinusoidal due to the nonlinear conductivity of the plasma medium. The misshapened output is no longer a single frequency but rather is the sum of all harmonic frequencies. Such even-order and odd-order distortion products are the created harmonics of the plasma processing apparatus.

Figure 4:
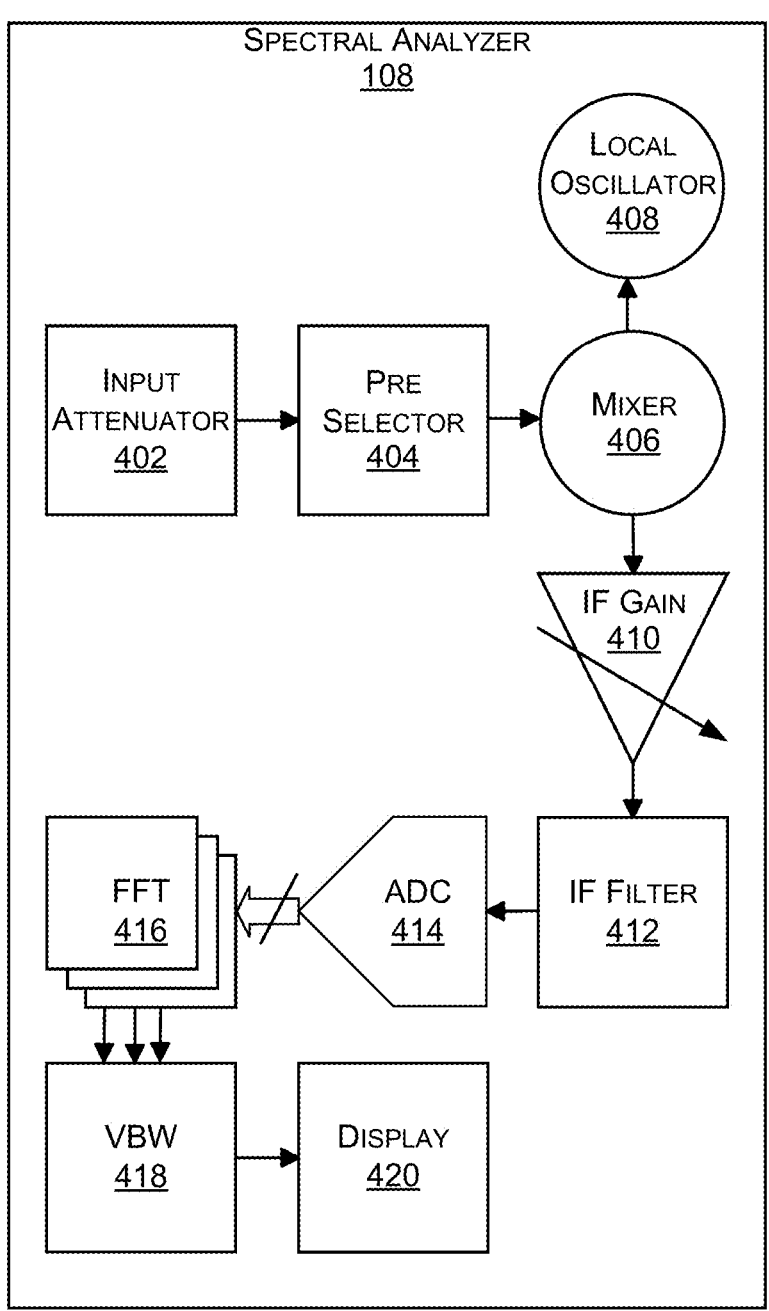
FIG. 4 illustrates a block diagram of a spectral analyzer, in accordance with an embodiment of the present disclosure.

FIG. 4 illustrates a block diagram of a spectral analyzer 108, in accordance with an embodiment of the present disclosure. In an embodiment of the present disclosure, the spectral analyzer 108 includes an RF input attenuator 402, a pre-selector 404, a low-pass filter, a local oscillator 408, a mixer 406, an Intermediate Frequency (IF) gain module 410, an Intermediate Frequency (IF) filter 412, an analog-to-digital converter 414, a fast Fourier transform module 416, a video bandwidth filter 418, and a display 420. In an embodiment, the RF input attenuator 402 receives an input signal and controls the level of the input signal by reducing signal strength. Next, the controlled signal is provided to the pre-selector 404 or a low-pass filter to allow the filter of the signal to a required frequency. After filtering, the signal is provided to the mixer 406 which is communicatively coupled to the local oscillator 408 for changing the frequency of the signal. The IF gain module 410 and IF filter 412 may operate in tandem to return the gain at the intermediate frequency. After that, the analog-to-digital converter 414 converts the signal into a digital form i.e., digital IF such that the fast Fourier transform module 416 may convert it into individual spectral components and thereby provide frequency information about the signal. The Video Bandwidth (VBW) filter 418 may filter the noise to smooth the video traces in the individual spectral components provided by the fast Fourier transform module 416 to be displayed on the display 420.

Figure 5:
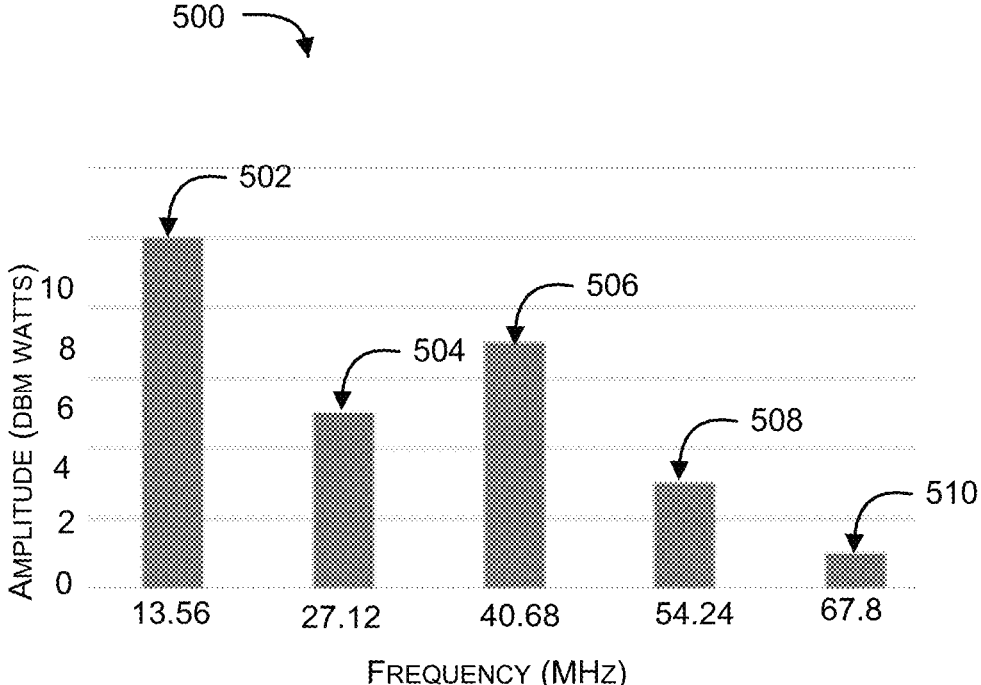
FIG. 5 illustrates a typical nonlinear load RF spectrum, in accordance with an exemplary embodiment of the present disclosure.

FIG. 5 illustrates a typical nonlinear load RF spectrum 500, in accordance with an exemplary embodiment of the present disclosure. As illustrated, the y-axis may represent amplitude (in dBm Watts) and the x-axis may represent frequency (in MHz). As shown in FIG. 5, the amplitude at a frequency of 13.56 MHz, as shown by 502, is 10 dBm Watts. Further, the amplitude at a frequency of 27.12 MHz, as shown by 504, is 5 dBm Watts. The amplitude at a frequency of 40.68 MHz, as shown by 506, is 7 dBm Watts. The amplitude at a frequency of 54.24 MHz, as shown by 508, is 3 dBm Watts. Further, the amplitude at a frequency of 67.8 MHz, as shown by 510, is 1 dBm Watts.

Figure 6:
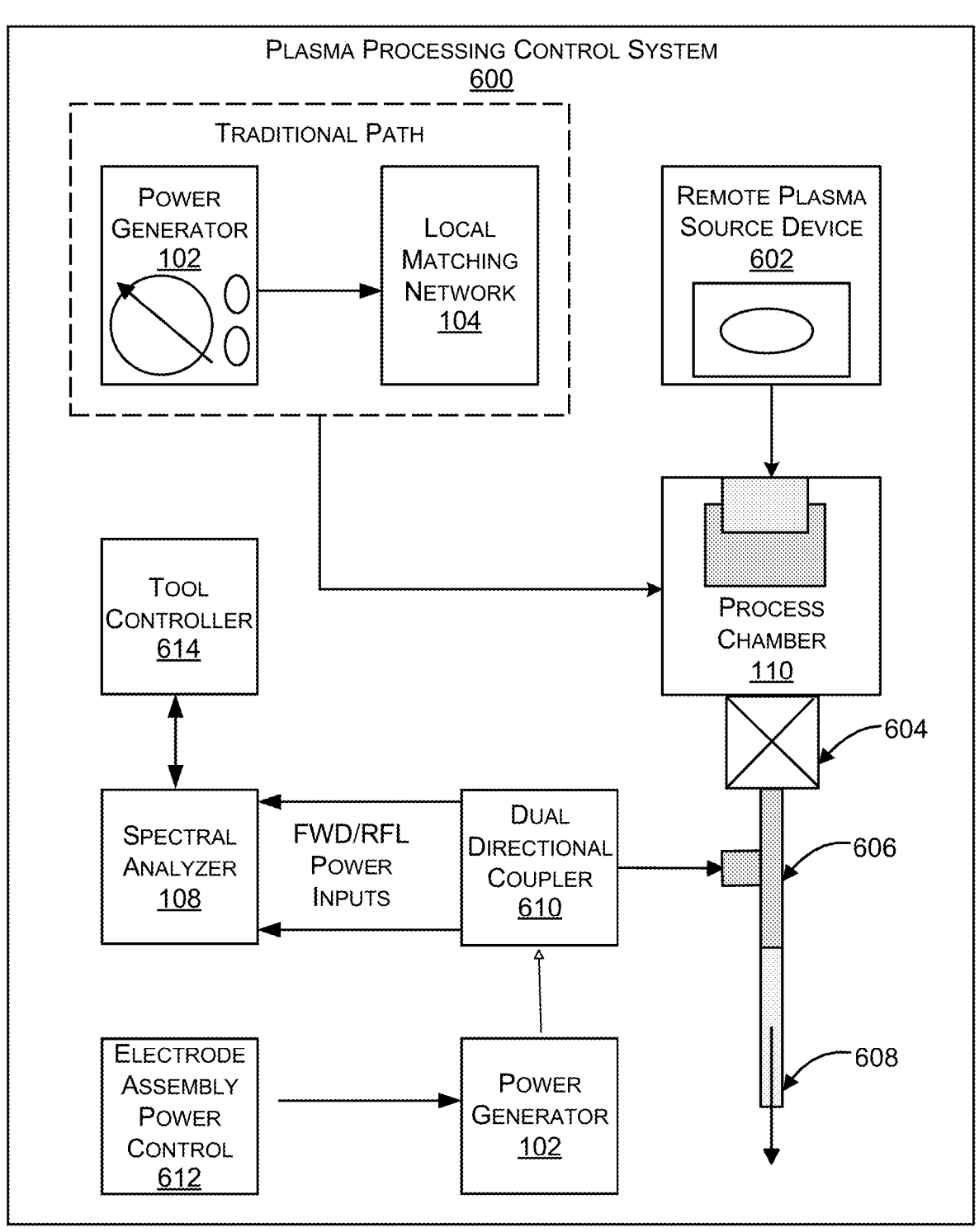
FIG. 6 illustrates a block diagram of a plasma processing control system for detecting an endpoint in downstream plasma processing and controlling plasma processing, in accordance with various embodiments of the present disclosure.

FIG. 6 illustrates a block diagram of a plasma processing control system 600. For detecting endpoint in a downstream plasma processing, in accordance with various embodiments of the present disclosure. The downstream plasma processing refers to a configuration where the plasma may be generated remotely relative to a process chamber 110 and only reactive species produced by the remote plasma reach the process chamber 110. In an embodiment, a remote plasma source 602 may be installed remotely from the process chamber 110. In contrary to the traditional in-situ plasma processing, where the plasma is generated directly above the substrate and ions can play an important part in the reaction process, the proposed plasma processing control system 600 is designed to work even for remote plasma processing setup where a remote plasma source device 602 generates plasma at a distance from the substrate and only reactive species produced by the plasma reach the process chamber 110. With no plasma in the process chamber, there is no RF impedance to measure there. So to implement impedance measurements an electrode assembly 606 can be installed into foreline and a small localized plasma is created at this location. For standard production, chamber cleans, measurement of the voltage, current and phase at the supplied frequency (e.g., 13.56 MHz) driving the electrode assembly is observed to determine endpoint for each process. In an embodiment of the present disclosure, the plasma processing control system 600 may include an exhaust line 604, an electrode assembly 606, a vacuum pump 608, a dual directional coupler 610, a power generator 102, an electrode assembly power controller 612, one or more spectral analyzers 108, and a tool controller 614. The exhaust line 604 may be formed in the plasma processing chamber 110, such that effluents from the plasma processing may be egressed from the plasma processing chamber 110 through the exhaust line 604. In an embodiment, the vacuum pump 608 pulls out the effluents from the plasma processing chamber 110. In an embodiment of the present disclosure, the electrode assembly 606 may be inserted in the exhaust line 604 to receive the egressed effluents as a feed gas. In an embodiment, the power generator 102 may generate energy for ionizing the received feed gas in the electrode assembly 606. Further, the ionization of the received feed gas leads to the formation of a plasma environment in the electrode assembly 606 to create a small capacitively coupled plasma. In an embodiment of the present disclosure, the electrode assembly power controller 612 may be coupled to the power generator 102 to control the amount of power being supplied by the power generator 102. Thus, the electrode assembly power controller 612 may facilitate modification of frequency and power of the generated energy to match with the plasma environment.

In an embodiment of the present disclosure, the dual directional coupler 610 may be coupled between the electrode assembly 606 and the power generator 102. Thus, the dual directional coupler 610 can provide both sampled forward power to the electrode assembly 606 and sampled reflected power from the electrode assembly 606 as outputs.

In an embodiment of the present disclosure, the one or more spectrum analyzers 108 may analyze both the received forward and reflected power. In one instance, one spectrum analyzer 108 may be utilized to analyze both the received forward and reflected power. In another instance, different spectrum analyzers 108 may be utilized for the received forward and reflected power. Further, the one or more spectrum analyzers 108 may detect an endpoint of the plasma processing based on the analysis of the received forward and reflected power. In an embodiment of the present disclosure, the one or more spectrum analyzers 108 may utilize RF spectroscopy to analyze the received forward and reflected power and detect the endpoint of the plasma processing.

In an embodiment of the present disclosure, the tool controller 614 may stop the plasma processing based on the detected endpoint. In one implementation, the tool controller 614 may be an ON-OFF controller to provide a digital output signal that switches OFF one or more components of the plasma processing apparatus to stop the plasma processing. In another implementation, the tool controller 614 may be a smart controller, such as a fuzzy logic controller, to turn OFF one or more components of the plasma processing apparatus to stop the plasma processing based on the detected endpoint.

Figure 7:
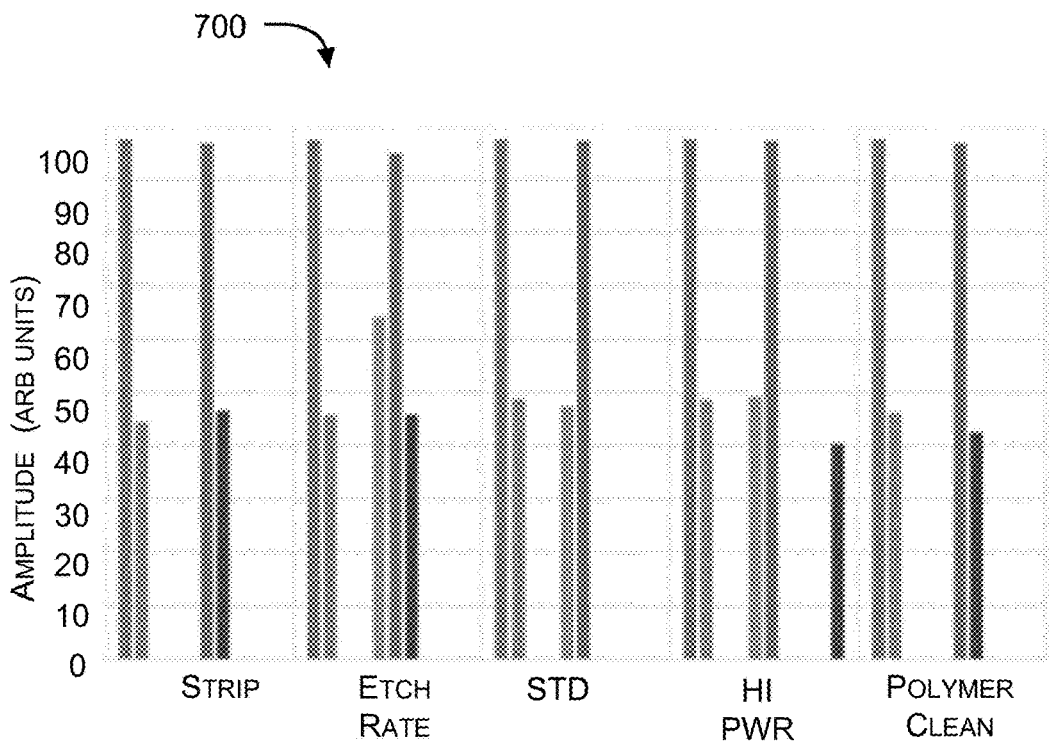
FIG. 7 illustrates process fingerprints 700 for different processes, created using spectral analysis in accordance with an exemplary embodiment of the present disclosure.
Figure 8:
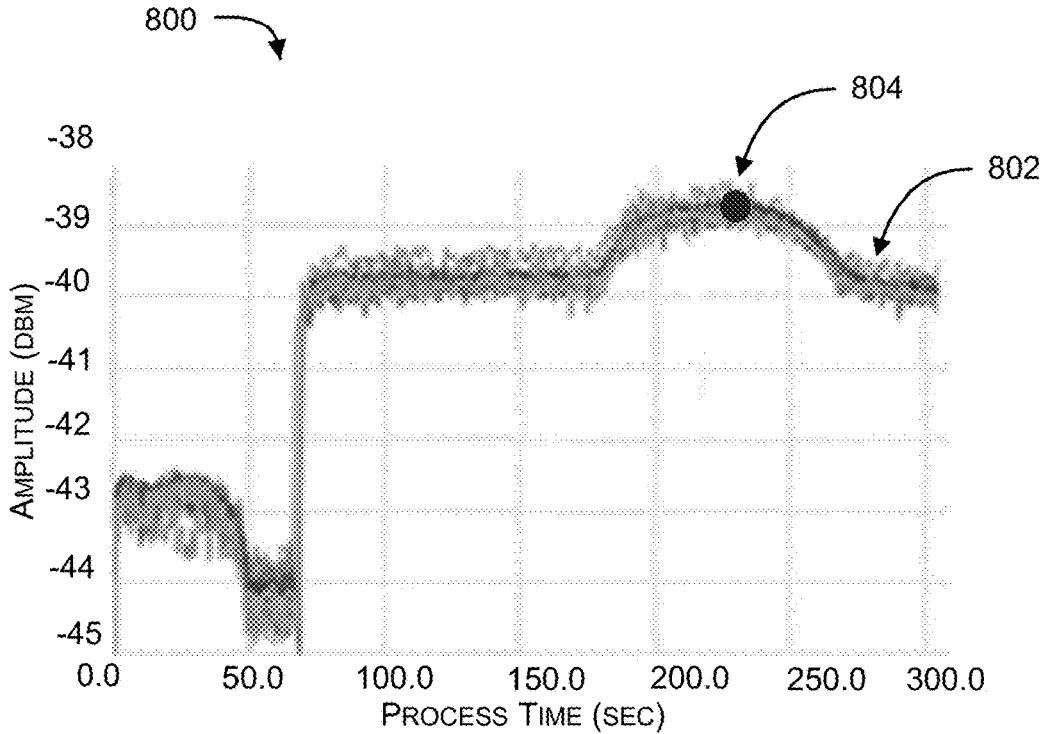
FIG. 8 illustrates a harmonic showing an end-point, in accordance with an exemplary embodiment of the present disclosure.

FIG. 7 illustrates process fingerprints 700 for different processes, created using spectral analysis in accordance with an exemplary embodiment of the present disclosure. The process fingerprints can be used to determine the endpoint for each process of the plasma processing. As illustrated, the inverted spectrum of the power generator 13.56 MHz power by process voltage spectra are equal to forward power spectra and current spectra are equal to reflected power spectra FIG. 8 illustrates a graph 800 of the 1.2 MHz harmonic of a 400 kHz process 802 showing an end-point 804, in accordance with an exemplary embodiment of the present disclosure. As illustrated, the y-axis of the graph 800 represents amplitude in dBm and the x-axis of the graph represents process time in seconds. In an illustrated embodiment of the present disclosure, based on analysis of the harmonic 802 the end-point 804 is determined between 200-250 seconds at an amplitude of −38 to −39 dBm.

Figure 9:
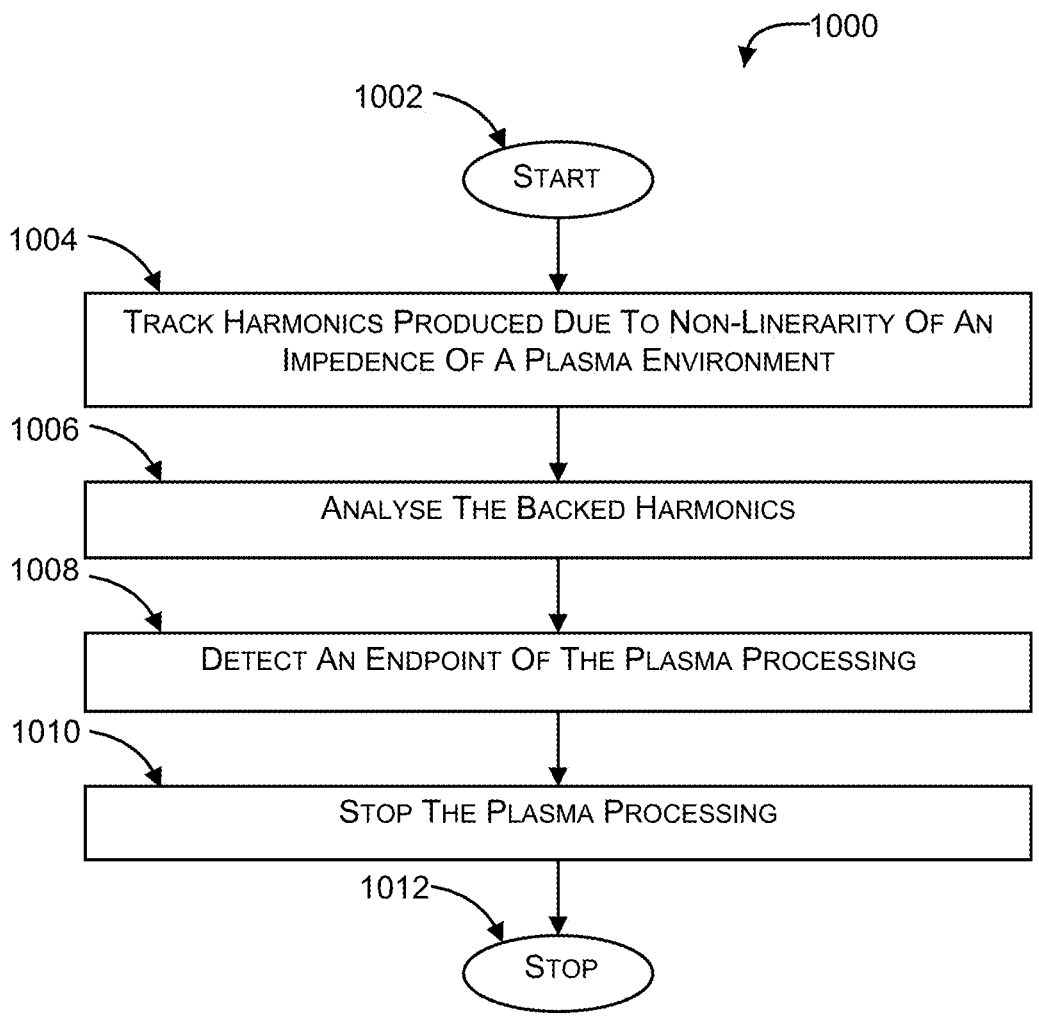
FIG. 9 illustrates a flowchart of a plasma processing control method for detecting endpoint in plasma processing, in accordance with an embodiment of the present disclosure.

FIG. 9 illustrates a flowchart 1000 of a plasma processing control method for detecting endpoint in plasma processing, in accordance with an embodiment of the present disclosure. The plasma processing control method starts at step 1002.

At step 1004, one or more harmonics may be tracked. The one or more harmonics may be associated with voltage, current, or a combination thereof. In an embodiment, the plasma processing control method includes utilizing a voltage-sensitive transducer and a current-sensitive transducer to track the voltage harmonics and the current harmonics, respectively. Further, the one or more harmonics may be produced due to the nonlinearity of an impedance of a plasma environment. The impedance of the plasma environment is a non-50-ohm impedance, a complex nonlinear impedance, or a combination thereof. In this embodiment, there is no voltage-current transducer assembly, rather the frequency dependent data comes from the spectrum analyzer. However, it should be noted that as the voltage and current waves at the point of use are comprised of an infinite series of harmonic frequencies, so is the sampled forward and reflected power waves.

Next, at step 1006, the tracked one or more harmonics may be analyzed. Upon analysis, an endpoint of plasma processing may be detected based on the analysis of the tracked one or more harmonics, at step 1008. The plasma processing is performed by depositing or removing a film on a substrate. In an embodiment, the plasma processing control method may include utilizing RF spectroscopy to analyze the tracked one or more harmonics, Thereafter, the plasma processing may be stopped based on the detected endpoint, at step 1010. In an embodiment, the plasma processing control method may include utilizing RF spectroscopy to detect the endpoint of the plasma processing. The plasma processing control method ends at step 1012.

In an embodiment of the present disclosure, the plasma processing control system 600 and method disclosed in the present disclosure (for the sake of brevity, hereinafter termed as 'disclosed mechanism') accurately detect the end-point of the plasma processing. Since the disclosed mechanism utilizes the harmonics generated during plasma processing to detect an endpoint of the plasma processing and is independent of the physical parameters of the plasma processing such as the material of the substrate, the type of gas used, and the pressure inside the process chamber, the disclosed mechanism overcomes the problem of the lack of accuracy due the dependency on the one or more physical parameters. Since the disclosed mechanism provides a reliable and consistent indication of when to stop the plasma process, it achieves the desired level of performance and quality in the final product thus ensuring consistency and repeatability across multiple processing runs. Since having an accurate idea of when to stop the plasma processing allows for tighter process control and optimization, the disclosed mechanism allows adjustment and fine-tuning of the plasma processing to achieve optimal results by setting the end point to a specific-criteria such as a certain level of surface energy or thickness. Further, the disclosed mechanism is cost-effective since the accurate determination of the end-point helps to minimize the cost of the plasma processing by reducing the amount of time and energy required for the process. Also, by ending the process at optimal point, unnecessary processing steps can be eliminated leading to further cost savings. Additionally, the disclosed mechanism improves safety since the plasma processing can be hazardous, and accurate determination of the end point helps in ensuring that the process is stopped before any unsafe conditions arise. Thus, the disclosed mechanism helps to protect the operators and components from damage and reduce the risk of accidents.

Figure 10:
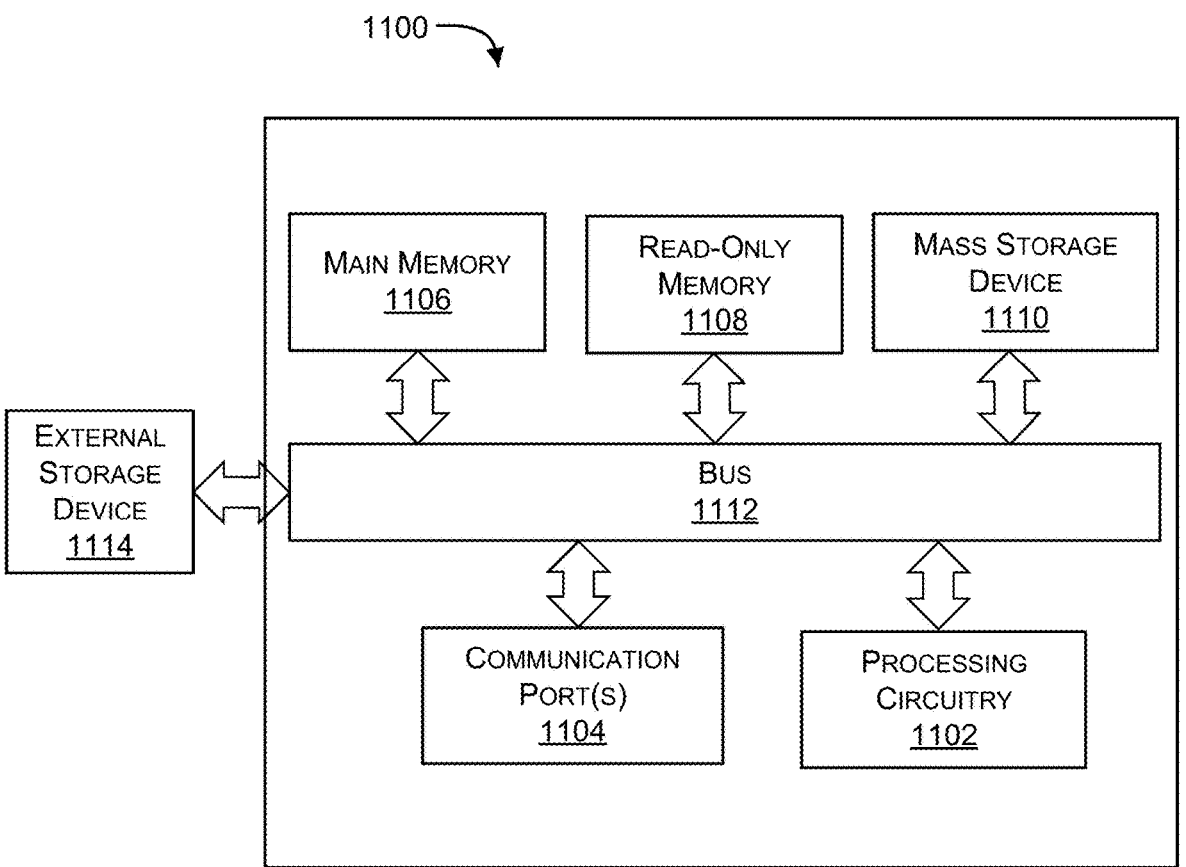
FIG. 10 illustrates an exemplary computer system in which or with which embodiment of the present disclosure may be utilized.

FIG. 10 illustrates an exemplary computer system in which or with which embodiment of the present disclosure may be utilized. As shown in FIG. 11, a computer system includes an external storage device 1102, a bus 1104, a main memory 1106, a read-only memory 1108, a mass storage device 1110, a communication port 1112, and a processor 1114.

Those skilled in the art will appreciate that computer system 1100 may include more than one processor 1114 and communication ports 1112. Examples of processor 1114 include, but are not limited to, an Intel® Itanium® or Itanium 2 processor(s), or AMD® Opteron® or Athlon MP® processor(s), Motorola® lines of processors, Forti-SOC™ system on chip processors or other future processors. Processor 1114 may include various modules associated with embodiments of the present disclosure.

Communication port 1112 can be any of an RS-232 port for use with a modem-based dialup connection, a 10/100 Ethernet port, a Gigabit or 10 Gigabit port using copper or fiber, a serial port, a parallel port, or other existing or future ports. Communication port 1112 may be chosen depending on a network, such as a Local Area Network (LAN), Wide Area Network (WAN), or any network to which the computer system connects.

Memory 1106 can be Random Access Memory (RAM), or any other dynamic storage device commonly known in the art. Read-Only Memory 1108 can be any static storage device(s) e.g., but not limited to, a Programmable Read-Only Memory (PROM) chips for storing static information e.g., start-up or BIOS instructions for processor 1114.

Mass storage 1110 may be any current or future mass storage solution, which can be used to store information and/or instructions. Exemplary mass storage solutions include, but are not limited to, Parallel Advanced Technology Attachment (PATA) or Serial Advanced Technology Attachment (SATA) hard disk drives or solid-state drives (internal or external, e.g., having Universal Serial Bus (USB) and/or Firewire interfaces), e.g. those available from Seagate (e.g., the Seagate Barracuda 7200 family) or Hitachi (e.g., the Hitachi Deskstar 7K1000), one or more optical discs, Redundant Array of Independent Disks (RAID) storage, e.g. an array of disks (e.g., SATA arrays), available from various vendors including Dot Hill Systems Corp., LaCie, Nexsan Technologies, Inc. and Enhance Technology, Inc.

Bus 1104 communicatively couples processor(s) 1114 with the other memory, storage, and communication blocks. Bus 1104 can be, e.g., a Peripheral Component Interconnect (PCI)/PCI Extended (PCI-X) bus, Small Computer System Interface (SCSI), USB, or the like, for connecting expansion cards, drives, and other subsystems as well as other buses, such a front side bus (FSB), which connects processor 1114 to a software system.

Optionally, operator and administrative interfaces, e.g., a display, keyboard, and a cursor control device, may also be coupled to bus 1104 to support direct operator interaction with the computer system. Other operator and administrative interfaces can be provided through network connections connected through communication port 1112. An external storage device 1102 can be any kind of external hard-drives, floppy drives, IOMEGA® Zip Drives, Compact Disc-Read-Only Memory (CD-ROM), Compact Disc-Re-Writable (CD-RW), Digital Video Disk-Read Only Memory (DVD-ROM). The components described above are meant only to exemplify various possibilities. In no way should the aforementioned exemplary computer system limit the scope of the present disclosure.

While embodiments of the present disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

Thus, it will be appreciated by those of ordinary skill in the art that the diagrams, schematics, illustrations, and the like represent conceptual views or processes illustrating systems and methods embodying this disclosure. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this disclosure. Those of ordinary skill in the art further understand that the exemplary hardware, software, processes, methods, and/or operating systems described herein are for illustrative purposes and, thus, are not intended to be limited to any particular named.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Within the context of this document terms "coupled to" and "coupled with" are also used euphemistically to mean "communicatively coupled with" over a network, where two or more devices can exchange data with each other over the network, possibly via one or more intermediary device.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . and N, the text should be interpreted as requiring only one element from the group, not A plus N, or B plus N, etc.

While the foregoing describes various embodiments of the disclosure, other and further embodiments of the disclosure may be devised without departing from the basic scope thereof. The scope of the disclosure is determined by the claims that follow. The disclosure is not limited to the described embodiments, versions, or examples, which are included to enable a person having ordinary skill in the art to make and use the disclosure when combined with information and knowledge available to the person having ordinary skill in the art.

We claim:

1. A plasma processing control system for detecting an endpoint and controlling an in-situ plasma processing, the plasma processing control system comprising:
   a power generator configured to generate energy for ionizing a gas in a plasma processing chamber in which a substrate to be plasma-processed is kept, wherein the ionizing creates a plasma environment for plasma processing the substrate;
   a transducer assembly configured to
      track one or more harmonics produced due to nonlinearity of impedance of the plasma environment, wherein the one or more harmonics are associated with at least one of voltage or current;
   one or more spectrum analyzers configured to
      perform analysis, via RF spectroscopy, of the one or more harmonics, and
      detect an endpoint of the plasma processing based on the analysis; and
   a controller configured to stop the plasma processing based on the endpoint.

2. The plasma processing control system of claim 1, wherein the power generator corresponds to at least one of a Radio Frequency (RF) power generator, an electromagnetic power generator, or a Remote Plasma System (RPS) system.

3. The plasma processing control system of claim 1, wherein the power generator is further configured to generate a high-frequency wave having a single sinusoidal frequency with a nominal 50-ohm output impedance and wherein the high-frequency wave includes at least one of RF or an electromagnetic wave.

4. The plasma processing control system of claim 3, further comprising a local matching network configured to match the output impedance of the high-frequency wave with the impedance of the plasma environment.

5. The plasma processing control system of claim 1, wherein the substrate is associated with at least one of a semiconductor or display manufacturing.

6. The plasma processing control system of claim 1, wherein the plasma processing is performed for at least one of depositing or removing a film on the substrate.

7. The plasma processing control system of claim 1, wherein the impedance of the plasma environment is at least one of: a non-50-ohm impedance or a complex nonlinear impedance.

8. The plasma processing control system of claim 1, wherein the transducer assembly includes a voltage-sensitive transducer and a current-sensitive transducer configured to track the one or more harmonics.

9. The plasma processing control system of claim 1, wherein each of the one or more spectrum analyzers includes at least one of an RF input attenuator, a pre-selector, a low-pass filter, a local oscillator, a mixer, an Intermediate Frequency (IF) gain module, an IF filter, an analog-to-digital converter, a digital IF, a fast Fourier transform module, a video bandwidth filter, or a display.

10. A plasma processing control system for detecting an endpoint using a remote downstream plasma in an exhaust line of a process tool comprising:
   an electrode assembly inserted in an exhaust line of a plasma processing chamber and configured to receive effluent as a feed gas;
   a power generator configured to generate energy for ionizing the feed gas, wherein the ionizing leads to formation of a plasma environment to create a small capacitively coupled plasma;
   a dual directional coupler coupled between the electrode assembly and the power generator, such that both forward power to the electrode assembly and reflected power from the electrode assembly are sampled at dual directional coupler outputs; and
   one or more spectrum analyzers configured to:
      perform, via RF spectroscopy, analysis of the forward power and reflected power from the dual directional coupler outputs, wherein the dual directional coupler provides outputs of a sampled forward power wave and a corresponding reflected power wave and wherein the outputs serve as inputs to an endpoint detection algorithm;
      provide nonlinear conductivity phenomena for creating harmonics in the sampled forward power wave and corresponding reflected power wave;
      detect an endpoint of the plasma processing based on the analysis; and
      a controller configured to stop a plasma processing based on the detected endpoint.

11. The plasma processing control system of claim 10, wherein the power generator corresponds to at least one of a Radio Frequency (RF) power generator, an electromagnetic power generator, or a Redundant Power Supply (RPS) system.

12. The plasma processing control system of claim 10, wherein the power generator is further configured to generate a high-frequency wave having a single sinusoidal frequency with a nominal 50-ohm output impedance and wherein the high-frequency wave includes at least one of RF or an electromagnetic wave.

13. The plasma processing control system of claim 10, further comprising an electrode assembly power control configured to control an amount of power being supplied by the power generator.

14. A plasma processing control method for detecting endpoint and controlling plasma processing, the plasma processing control method comprising:

tracking one or more harmonics that are produced due to nonlinearity of impedance of a plasma environment, wherein the one or more harmonics are associated with at least one of voltage or current;

analyzing, via RF spectroscopy, the one or more harmonics;

detecting an endpoint of the plasma processing based on the analyzing; and stopping the plasma processing based on the endpoint.

15. The plasma processing control method of claim 14, wherein the plasma processing is performed for at least one of depositing or removing a film on a substrate.

16. The plasma processing control method of claim 14, wherein the impedance is at least one of a non-50-ohm impedance or a complex nonlinear impedance.

17. The plasma processing control method of claim 14, further comprising using a voltage-sensitive transducer and a current-sensitive transducer to track the one or more harmonics.

* * * * *